US011754641B2

(12) United States Patent
Nguyen et al.

(10) Patent No.: US 11,754,641 B2
(45) Date of Patent: Sep. 12, 2023

(54) TRANSFORMER TEST SYSTEM AND METHOD

(71) Applicant: AVO Multi-Amp Corporation, Dallas, TX (US)

(72) Inventors: Lam Truong Nguyen, Coppell, TX (US); Yuan Wei, Flower Mound, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 0 days.

(21) Appl. No.: 17/494,586

(22) Filed: Oct. 5, 2021

(65) Prior Publication Data

US 2022/0107365 A1    Apr. 7, 2022

Related U.S. Application Data

(60) Provisional application No. 63/088,338, filed on Oct. 6, 2020.

(51) Int. Cl.
*G01R 31/62* (2020.01)
*H01H 9/00* (2006.01)

(52) U.S. Cl.
CPC ........... *G01R 31/62* (2020.01); *H01H 9/0005* (2013.01); *H01H 2009/0061* (2013.01)

(58) Field of Classification Search
CPC ................. G01R 31/62; H01H 9/0005; H01H 2009/0061; H01H 9/00
USPC ........................................................ 324/726
See application file for complete search history.

(56) References Cited

U.S. PATENT DOCUMENTS

| 2,910,646 | A | | 10/1959 | Schutzner |
| 5,276,402 | A | | 1/1994 | Schucht |
| 5,396,172 | A | | 3/1995 | Lat et al. |
| 6,011,381 | A | * | 1/2000 | Andrei ...................... G05F 1/14 323/215 |
| 6,987,390 | B2 | | 1/2006 | Suss et al. |

(Continued)

OTHER PUBLICATIONS

Valance NETA World Back to the Basics Current Transformer Testing ¬in view of, Fall-Winter 2004, pp. 1-8 (Year: 2004).*

(Continued)

*Primary Examiner* — Jermele M Hollington
*Assistant Examiner* — Courtney G McDonnough
(74) *Attorney, Agent, or Firm* — Conley Rose, P.C.; J. Robert Brown, Jr.

(57) ABSTRACT

A system for testing a transformer includes a voltage source configured to apply an input voltage to a secondary winding of the transformer, the input voltage is configured to induce a voltage in a primary winding of the transformer. A primary voltmeter is configured to measure the induced voltage in the primary winding, a plurality of secondary voltmeters configured to measure voltage in a plurality of secondary windings of the transformer, and one or more phase angle meters to simultaneously measure a plurality of phase angles between the primary voltage and each of the plurality of secondary voltages. A controller is connected to the voltage source, the primary voltmeter, the plurality of secondary voltmeters, and the one or more phase angle meters, the controller is configured to calculate a plurality of winding ratios based on the voltage and phase angle measurements, the controller is also configured to identify all secondary taps.

20 Claims, 6 Drawing Sheets

(56) References Cited

U.S. PATENT DOCUMENTS

| | | | |
|---|---|---|---|
| 9,128,134 | B2 | 9/2015 | Milner et al. |
| 9,772,362 | B2 | 9/2017 | Milner et al. |
| 10,527,662 | B2 | 1/2020 | Milner et al. |
| 2004/0130329 | A1 | 7/2004 | Suss et al. |
| 2005/0212506 | A1 | 9/2005 | Khalin et al. |
| 2008/0136426 | A1 | 6/2008 | Fawcett |
| 2012/0158325 | A1 | 6/2012 | Banerjee et al. |
| 2012/0249278 | A1* | 10/2012 | Krok ............ H02J 3/1878 336/150 |
| 2019/0227108 | A1* | 7/2019 | Iwanusiw ............ G01R 29/20 |

OTHER PUBLICATIONS

IEEE Power Engineering Society; "IEEE Guide for Field Testing of Relaying Current Transformers"; IEEE Std C57.13.1-2006; Feb. 28, 2007; 39 pages.

IEEE Power Engineering Society; "IEEE Standard Conformance Test Procedure for Instrument Transformers"; IEEE Std C57.13.2-2005; Sep. 29, 2005; 14 pages.

IEEE Power Engineering Society; "IEEE Guide for Grounding of Instrument Transformer Secondary Circuits and Cases"; IEEE Std C57.13.3-2005; May 8, 2006; 43 pages.

IEEE Power Engineering Society; "IEEE Standard of Performance and Test Requirements for Instrument Transformers of a Nominal System Voltage of 115 kV and Above"; IEEE Std C57.13.5-2003; Aug. 1, 2003; 53 pages.

IEEE Power Engineering Society; "IEEE Standard for High-Accuracy Instrument Transformers"; IEEE Std C57.13.6 -2005; Dec. 9, 2005; 16 pages.

International Electrotechnical Commission (IEC); "Amendment 1, Instrument Transformers—Part 1: Current Transformers"; International Standard 60044-1; 1996; 109 pages.

European Committee for Electrotechnical Standardization (CENELEC); "Instrument Transformers, Part 6: Requirements for Protective Current Transformers for Transient Performance"; European Standard 60044-6; Mar. 1999; 48 pages.

Iwanusiw, Oleh; "The Art and Science of Testing—Relaying Current Transformers"; Nov. 25, 2005 Bangalore; 7 pages.

Iwanusiw, Oleh; "Modern Methods of Testing Relaying CTs"; 9 pages.

Iwanusiw, Oleh; "CTERP-2000 Comparison with ANSI C57.13 1"; Eitel Industries; Bangalore, India; 2 pages.

Elleuch, Mohammed, et al.; "Analytical Model of Iron Losses in Power Transformers"; IEEE Transactions on Magnetics; vol. 39, No. 2; Mar. 2003; 8 pages.

Amar, M., et al.; "A Simple Method for the Estimation of Power Losses in Silicon Iron Sheets Under Alternating Pulse Voltage Excitation"; IEEE Transactions on Magnetics; vol. 30, No. 2; Mar. 1994; 3 pages.

Werstiuk, Chris; "Back to the Basics-Current Transformer Testing"; NETA World; The Official Publication of the InterNational Electrical Testing Association; Jan. 2004; 8 pages.

Avo Multi-Amp Corporation; "Instruction Manual for Current Transformer Excitation Test Set, Model CTER-91" 1992; 30 pages.

Megger; "Multi-Tap Automatic Current Transformer Saturation, Ratio and Polarity Test Set"; MCT1605; May 12, 2011; 4 pages.

Office Action dated Oct. 16, 2014; U.S. Appl. No. 13/660,816, filed Oct. 25, 2012; 28 pages.

Final Office Action dated May 29, 2015; U.S. Appl. No. 13/660,816, filed Oct. 25, 2012; 12 pages.

Notice of Allowance dated Jul. 24, 2015; U.S. Appl. No. 13/660,816, filed Oct. 25, 2012; 11 pages.

Office Action dated Nov. 22, 2016; U.S. Appl. No. 14/846,324, filed Sep. 4, 2015; 49 pages.

Notice of Allowance dated Jul. 20, 2017; U.S. Appl. No. 14/846,324, filed Sep. 4, 2015; 13 pages.

Notice of Allowance dated Aug. 23, 2019; U.S. Appl. No. 15/714,384, filed Sep. 25, 2017; 19 pages.

PCT International Search Report; Application No. PCT/US2013/066363; dated Mar. 21, 2014; 2 pages.

PCT Written Opinion of the International Searching Authority; Application No. PCT/US2013/066363; dated Mar. 21, 2014; 5 pages.

European Extended Search Report; Application No. 13849603.9; dated Jun. 30, 2016; 9 pages.

European Examination Report; Application No. 13849603.9; dated Dec. 19, 2018; 6 pages.

European Examination Report; Application No. 13849603.9; dated Sep. 27, 2019; 5 pages.

European Summons to Attend Oral Proceedings; Application No. 13849603.9; Oct. 22, 2020; 8 pages.

* cited by examiner

```
TTR                100 100 200    400
Sec Windng  ^^^^^^^^^^^^^^^^^^^^^^^^^^^
Correct     1   2   3    4     5
-------------------------------------
Arb Conn    4   3   5    2     1
Ref Assoc   A   B   C    D     E
Ratio Mx    0  -200 600 -300 -400

Taps[5][2] =
    {
        /*0*/  A,   B,    C,    D,    E,     //Ref Assoc
        /*1*/  0,  -200, 600, -300, -400     //Ratio Mx - Ratio measure with negative as 180 degree, positive = inphase
    };
#define N_TAP 5
Weight = 0; //ratio additive after swap while(true)
{
    for(i=1; i<N_TAP /*5-taps*/; i++) //start from the second one. First one is always 0, b/c it reference itself
    {
        if ( Taps[i][1] < 0 ) //negative - we need to swap the tap
        {
            TempTap = Taps[i][0]; //remember the tap before being swapped
            Taps[i][0] = Taps[0][0];
            Taps[0][0] = TempTap;
            Weight = Taps[i][1] * (-1); //Weight is now positive number to be adding to other tap
            Taps[i][1] += Weight; //The tap that got swap will need to be *(-1), effectively by adding Weight twice. One weight added here
            break;
        }
    }
    if(i== (N_TAP - 1) )
    {
        break;
    }

//adding weight to the main tap due to the swap
    for(i=1; i<N_TAP /*5-taps*/; i++)
    {
        Taps[i][1] += Weight;
    }
}

//At the end of this algorithm
//Result will be
//Arb Conn    1    2    3    4    5
//Ref Assoc   E    D    B    A    C
//Ratio Mx    0   100  200  400  800

There are 2 possibilities:
1. If H is connected correct, then the pattern is left to right (of the table)
2. If H is swapped, then the pattern will be right to left
```

FIG. 3A

|   |   |   |   |   |   |
|---|---|---|---|---|---|
|   | 100 | 100 | 200 | 400 | } 314  ← 310 |
| 1 | 2 | 3 | 4 | 5 | } 312 |
| 4 | 3 | 5 | 2 | 1 | } 316 |
| A | B | C | D | E | } 318 |
| A | B | C | D | E | ← 320 |
| 0 | -200 | 400 | -300 | -400 | } 320A |
| B | A | C | D | E | ← 322 |
| 0 | 200 | 600 | -100 | -200 | } 322A |
| D | A | C | B | E | ← 324 |
| 0 | 300 | 700 | 100 | -100 | } 324A |
| E | A | C | B | D | ← 326 |
| 0 | 400 | 800 | 200 | 100 | } 326A |

Sort Sequence

| E | D | B | A | C | ← 328 |
|---|---|---|---|---|---|
| 0 | 100 | 200 | 400 | 800 |  |

| E(1) | D(2) | B(3) | A(4) | C(5) | ← 330 |
|---|---|---|---|---|---|
| 0 | 100 | 200 | 400 | 800 |  |

TRANSFORMER TEST SYSTEM AND METHOD

CROSS-REFERENCE TO RELATED APPLICATIONS

This patent application claims the benefit of U.S. Provisional Patent Application No. 63/088,338 filed Oct. 6, 2020 by Lam Truong Nguyen et al. entitled, "Transformer Test System and Method," which is hereby incorporated by reference. This application is related to U.S. Pat. No. 10,527,662 issued on Jan. 7, 2020 by David Hembree Milner, et al. entitled "Concurrent Transformer Test System and Method", which is a continuation of U.S. Pat. No. 9,772,362 issued on Sep. 26, 2017 by David Hembree Milner, et al. entitled, "Concurrent Transformer Test System and Method", which is a continuation of U.S. Pat. No. 9,128,134 issued on Sep. 8, 2015 by David Hembree Milner, et al. entitled, "Concurrent Transformer Test System and Method", all of which are incorporated by reference herein as if reproduced in their entireties.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Many power generation and distribution systems employ current transformers to monitor the flow of current through electrical devices. To ensure proper installation and operation, current transformers are often subjected to one or more tests performed in accordance with well-defined standards, e.g., IEEE C57.13.1, IEC 60044-1, and IEC 60044-6. Examples of these tests include ratio tests, excitation tests, burden tests, polarity tests, winding resistance tests, phase angle tests, etc. To calculate the ratio, excitation curve, and knee point of a current transformer using some traditional test methods, the primary conductor of the transformer must first be disconnected. With the primary circuit open, a test signal can be applied to the secondary winding and the resulting current/voltage in the primary winding may be measured. These results may then be used to determine characteristics used to evaluate the current transformer such as ratio, saturation curve, and knee point.

If the transformer is a multi-ratio current transformer having multiple taps, test leads may be changed (e.g., manually or with a relay switching matrix) and a similar test may be performed similar to that described above. This testing process is typically repeated for each combination of taps. Thus, multiple tests are typically performed to determine the ratios, saturation curves, and knee points for a multi-ratio current transformer. As such, conventional methods for testing current transformers can be relatively labor intensive and time-consuming.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

It should be understood at the outset that although illustrative implementations of one or more embodiments are illustrated below, the disclosed systems and methods may be implemented using any number of techniques, whether currently known or in existence. The disclosure should in no way be limited to the illustrative implementations, drawings, and techniques illustrated below, but may be modified within the scope of the appended claims along with their full scope of equivalents.

In an embodiment, a method is provided for testing a transformer. The method comprises applying an input voltage to a secondary winding of the transformer in order to induce a voltage in a primary winding of the transformer. The method includes measuring the induced voltage, and simultaneously measuring secondary voltages in a plurality of secondary windings of the transformer. The method further includes calculating a plurality of winding ratios based on the induced voltage measurement and the secondary voltage measurements.

In an embodiment, a tester is provided for testing a transformer. The tester comprises a voltage source configured to apply an input voltage to a secondary winding of the transformer, wherein the input voltage is configured to induce a voltage in a primary winding of the transformer. The tester includes a primary voltmeter configured to measure the induced voltage in the primary winding, and a plurality of secondary voltmeters configured to simultaneously measure voltage in a plurality of secondary windings of the transformer when the input voltage is applied. Additionally, the tester includes one or more phase angle meters to simultaneously measure a plurality of phase angles between the primary voltage and each of the plurality of secondary voltages. The tester further includes at least one processor configured to calculate a plurality of winding ratios based on the induced voltage measurement and the secondary voltage measurements.

In an embodiment, a system is provided for testing a transformer. The system comprises a voltage source configured to apply an input voltage to a secondary winding of the transformer, wherein the input voltage is configured to induce a voltage in a primary winding of the transformer. The system includes a primary voltmeter configured to measure the induced voltage in the primary winding, and a plurality of secondary voltmeters configured to simultaneously measure voltage in a plurality of secondary windings of the transformer when the input voltage is applied. Additionally, the system includes one or more phase angle meters to simultaneously measure a plurality of phase angles between the primary voltage and each of the plurality of secondary voltages. The system further includes a controller operatively connected to the voltage source, the primary voltmeter, the plurality of secondary voltmeters, and the plurality of secondary phase angle meters, wherein the controller is configured to calculate a plurality of winding ratios based on the induced voltage measurement, the secondary voltage measurements, and the phase angle measurements.

A method for testing a transformer, the method comprising applying an input voltage to any two secondary taps of the transformer in order to induce a voltage in a primary winding of the transformer. The method includes measuring the induced voltage in the primary winding, and measuring secondary voltages in a plurality of secondary windings of the transformer. The method provides for measuring phase angles as a function of the secondary voltages and the induced voltage, calculating a plurality of winding ratios based on the induced voltage measurement and the secondary voltage measurements, and identifying all secondary taps based on the phase angle measurements and the plurality of winding ratios.

In some embodiments, the method further provides for using the phase angle and windings measurements to determine a first weight between a first tap and each of the other taps; and determining a weight of a first tap (A) by measuring the weight of the first tap against itself such that the weight of the first tap is zero. In further embodiments, the method further provides the steps of: 1) determining a tap (B) having a first negative weight; 2) determining a new weight of tap (B) by multiplying the negative weight of tap (B) by negative one (−1) to obtain a first weight calculation, doubling the first weight calculation, and then adding the doubled first weight calculation to the negative weight of the tap (B); 3) swapping an order of the first tap (A) with that of the tap (B); and 4) determining a new weight for each of remaining taps (C, D, E) by adding a weight of each of the remaining taps (C, D, E) to the first weight calculation.

In other embodiments, a system for testing a transformer is provided that includes a voltage source configured to apply an input voltage to a secondary winding of the transformer, wherein the input voltage is configured to induce a voltage in a primary winding of the transformer. The system includes a primary voltmeter configured to measure the induced voltage in the primary winding, a plurality of secondary voltmeters configured to measure voltage in a plurality of secondary windings of the transformer when the input voltage is applied, and one or more phase angle meters to simultaneously measure a plurality of phase angles between the primary voltage and each of the plurality of secondary voltages. The system includes a controller operatively connected to the voltage source, the primary voltmeter, the plurality of secondary voltmeters, and the one or more phase angle meters, wherein the controller is configured to calculate a plurality of winding ratios based on the induced voltage measurement, the secondary voltage measurements, and the phase angle measurements, wherein the controller is further configured to identify all secondary taps based on the phase angle measurements and the plurality of winding ratios.

In still other embodiments, a system for testing a transformer is provided that includes a processor, a memory storing instructions that when executed by the processor cause the processor to receive a measurement of an induced voltage of a primary winding, measurements of voltages in a plurality of secondary windings of the transformer, measurements of a plurality of phase angles between the voltage of the primary windings and each of the voltages of the plurality of secondary windings, calculate a plurality of winding ratios based on the induced voltage measurement, the secondary voltage measurements, and the phase angle measurements, and identify all secondary taps based on the phase angle measurements and the plurality of winding ratios.

Disclosed herein are systems, apparatuses, and methods for testing a transformer. In an embodiment, the system comprises a tester including an ammeter, multiple phase angle meters, a primary voltmeter, and multiple secondary voltmeters. In operation, the tester may inject a voltage on any two taps of the transformer. In turn, the primary voltmeter may measure the voltage induced across a primary winding of the transformer, while the secondary voltmeters may simultaneously measure voltage outputs at secondary windings of the transformer. Moreover, the at least one phase angle meter may measure phase angles across the primary voltage to each of the voltages output at the secondary windings. The ammeter may also be used to measure current flowing through one or more of windings of the transformer. To reduce testing time, the tester may calculate the polarity, ratio, saturation curve, and knee point for each winding combination of the transformer based on the measurements simultaneously obtained by the ammeter, phase angle meters, and the primary and secondary voltmeters. The tester may further identify any tap of the transformer based on the polarity and ratio calculations.

Figure 1:
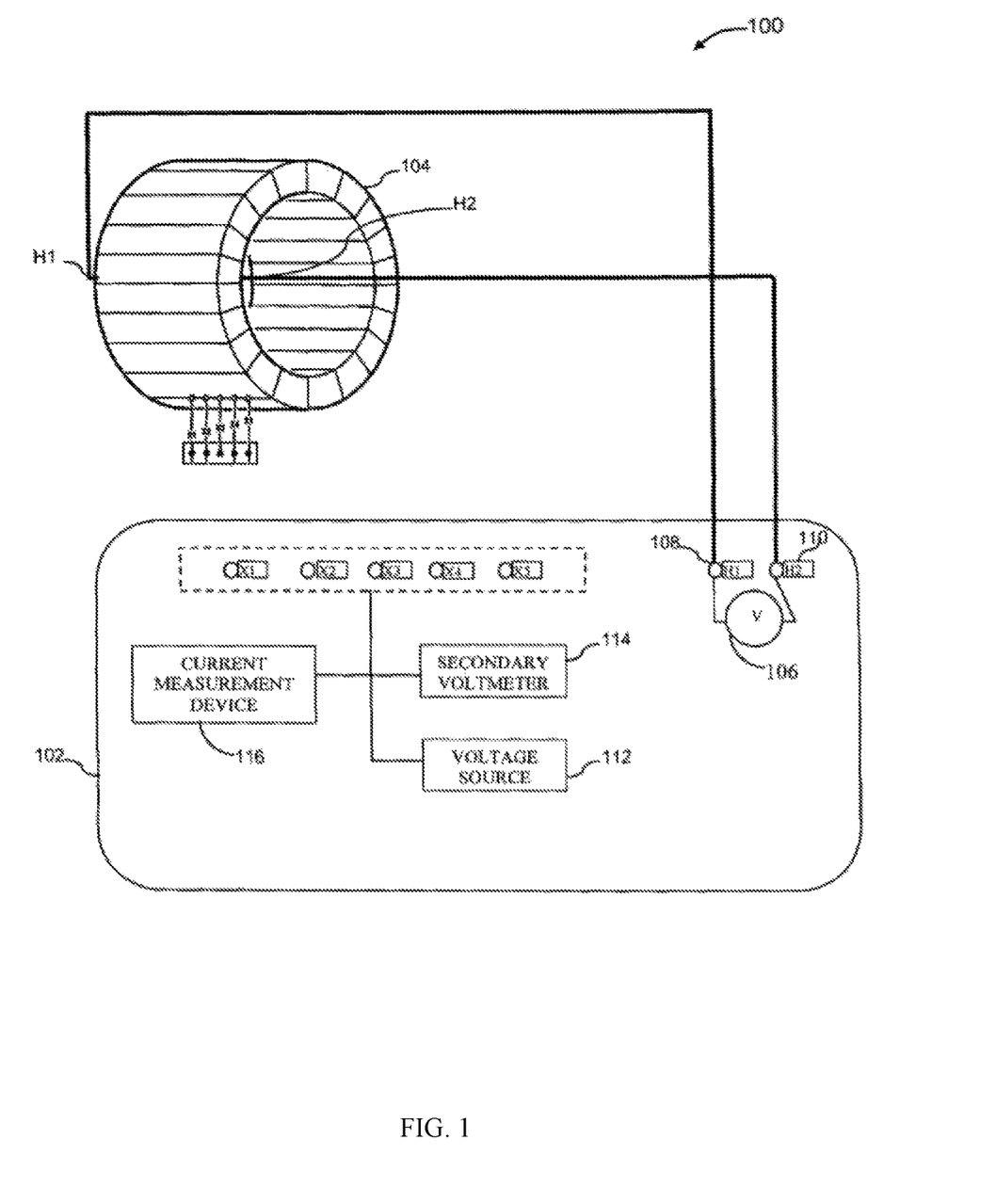
FIG. 1 is a schematic diagram of a transformer test system according to an embodiment of the present disclosure.

Referring to FIG. 1, a schematic diagram of a system 100 according to an embodiment of the present disclosure is shown. The system 100 comprises a portable tester 102 for testing equipment configured to operate at high voltages and/or currents, such as current transformers (CTs), generator current transformers (GCTs), internal bushing current transformers (BCTs), external slipover current transformers, etc. In the present example, the tester 102 will be described with respect to testing a conventional multi-ratio CT 104 comprising five taps, yet in other implementations the CT 104 may comprise more or less taps. Furthermore, although the testers disclosed herein may generally be described with respect to the arrangements shown in the drawings, it is to be understood that the testers may be differently configured and/or comprise more or less components without departing from the scope of the present disclosure.

The tester 102 comprises a primary voltmeter 106 for measuring the voltage across the primary (or high voltage) winding of the CT 104. The primary voltmeter 106 may include or be linked to a pair of primary connectors 108 and 110 for electrically connecting the primary voltmeter 106 (e.g., via a harness or test leads) to corresponding primary terminals H1 and H2 of the CT 104. While only two primary connectors 108 and 110 are depicted in FIG. 1, the tester 102 may comprise one or more primary connectors in other implementations.

The tester 102 further comprises an alternating current (AC) or direct current (DC) voltage source 112 configured to supply voltage to a secondary winding of the CT 104. At least one secondary voltmeter 114 is provided for measuring voltage output across the secondary winding, and any suitable current measurement device 116 may be provided to measure current flowing through the secondary winding. The voltage source 112, secondary voltmeter 114, and current measurement device 116 may include or be linked to a plurality of secondary connectors X1, X2, X3, X4, and X5, each of which being electrically attachable (e.g., via test leads or the like) to corresponding secondary terminals x1, x2, x3, x4, and x5 of the CT 104.

To perform a typical ratio test for a secondary winding (e.g., x1-x2) of the CT 104, the primary winding is usually open-circuited to prevent the circulation of current. The voltage source 112 may be connected to the secondary winding (e.g., via connectors X1 and X2) and configured to apply a voltage that may be fixed or adjusted (e.g., until an excitation current reaches saturation). When the voltage source 112 injects a voltage across the secondary winding, the primary voltmeter 106 may measure the voltage induced on the primary winding across the H1 and H2 terminals, and the current measurement device 116 and the secondary voltmeter 114 may measure current and voltage outputs at the secondary terminals (e.g., x1-x2). The tester 102 may then obtain voltage measurements from the primary and secondary voltmeters 106 and 114 to calculate the ratio (e.g., x1-x2:H1-H2) for the tested winding. The tester 102 may also use the ratio and/or other parameters (e.g., current/voltage data) to calculate the saturation curve and knee point for the tested winding.

Typically, the windings of a CT need to be individually tested to obtain the ratio, saturation curve, knee point, or other information for that particular winding. Since the CT 104 in FIG. 1 comprises four separate windings (i.e., x1-x2, x1-x3, x1-x4, and x1-x5), the CT 104 has 10 possible combinations (i.e., x1-x2, x1-x3, x1-x4, x1-x5, x2-x3, x2-x4, x2-x5, x3-x4, x3-x5, x4-x5) that can be tested. After testing one combination, test leads would need to be changed to test another winding combination. This may be achieved manually by a user changing test leads and running a ratio, saturation, knee point test, or automatically by internally switching leads (e.g., via integrated relays). Depending on the testing equipment, it may take about two to six minutes to complete a ratio, saturation, and knee point test for each possible winding combination. Thus, testing a multi-ratio transformer such as the CT 104 can be relatively time consuming. Further, some multi-tap CTs may have taps that are incorrectly labeled or not labeled at all, in which case a user may not be able to identify which taps of the CT are connected to the tester.

In some implementations, test leads may be provided for simultaneously attaching one or more of the secondary connectors X1, X2, X3, X4, and X5 of the tester 102 to the corresponding secondary terminals x1, x2, x3, x4, and x5 of the CT 104. As such, the tester 102 may be configured to automatically test all possible winding combinations without any lead switching or user intervention. To reduce overall testing time, a tester according to the present disclosure may be further configured to calculate the ratio for each winding combination based on multiple measurements obtained simultaneously during a single test. Moreover, the tester 102 may be configured to identify the taps used to perform the single test (e.g., even if the secondary terminals of the CT 104 are not visibly identified or otherwise known to the user of the tester 102). These and other features are described below with respect to FIG. 2.

Figure 2:
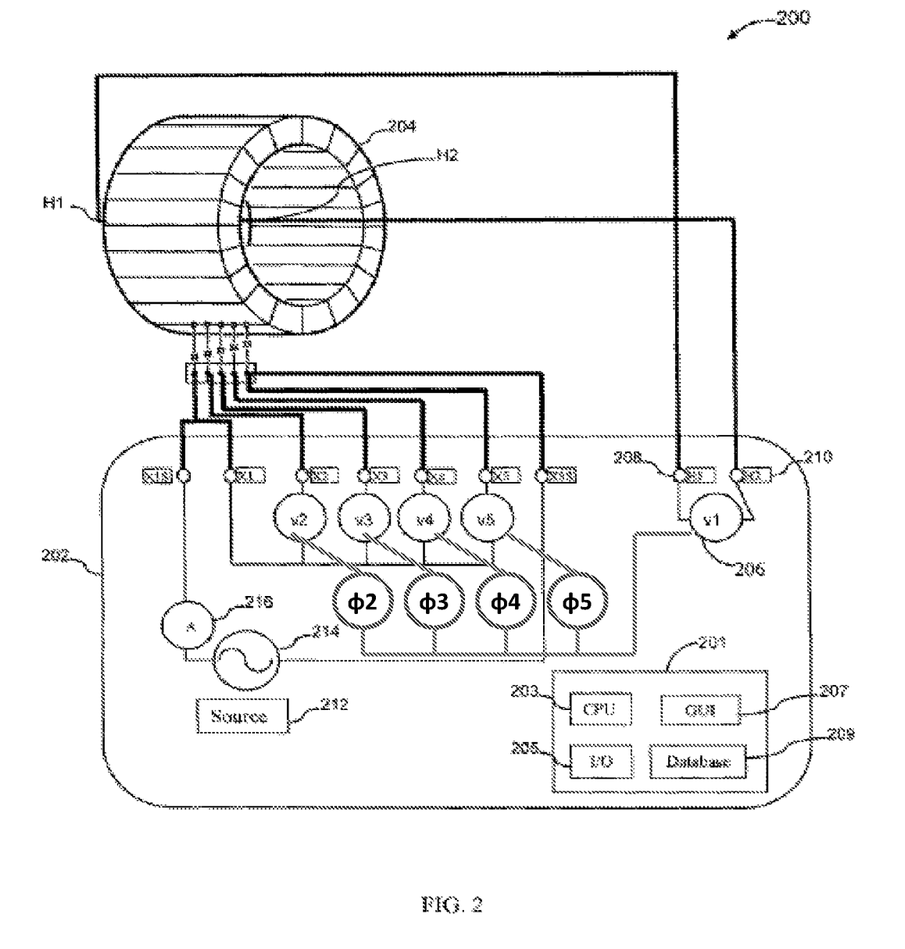
FIG. 2 is a schematic diagram of a transformer test system according to another embodiment of the present disclosure.

FIG. 2 depicts another embodiment of a system 200 comprising a portable tester 202. For convenience, the tester 202 will be described herein with respect to testing a multi-ratio CT 204 substantially similar to the CT 104 in FIG. 1. However, the tester 202 may be used for testing any suitable equipment configured to operate at high voltages and/or currents. Given the nature in which testing devices such as the tester 202 are often employed, the tester 202 may be ruggedized and shielded appropriately to withstand adverse conditions such as when operating in harsh electrical environments of a power generation and/or distribution station.

The tester 202 may comprise a controller 201 for controlling one or more components associated with the tester 202. The controller 201 may include or be operatively connected to a processor such as a microprocessor, microcontroller, or digital signal processor having a central processing unit (CPU) 203. The controller 201 may also include or be operatively connected to at least one input/output (I/O) component 205, graphical user interface (GUI) 207, and database 209 may be provided. In some implementations, the controller 201, CPU 203, I/O component 205, GUI 207, and/or database 209 may be integrated as one or more units.

The tester 202 comprises a primary voltmeter (v1) 206 for measuring the voltage across the primary winding of the CT 204. The primary voltmeter 206 may include or be linked to a pair of primary connectors 208 and 210 for electrically connecting the primary voltmeter 206 (e.g., via one or more supply leads) to corresponding primary terminals H1 and H2 of the CT 204. In other implementations, the tester 202 may comprise one or more primary connectors. The tester 202 further comprises a primary power source 212, which may be linked to main voltage and/or other power supplies capable of providing sufficient current and/or voltage. The primary power source 212 may include or be linked to an AC or DC voltage source 214 configured to supply voltage to at least one secondary winding of the CT 204. The voltage source 214 may be connected in series with an ammeter 216 or other suitable device(s) configured to measure current flowing through at least one secondary winding of the CT 204. Although only one ammeter 216 is shown the system may have multiple ammeters in other embodiments.

In an embodiment, the tester 202 comprises a plurality of secondary voltmeters v2, v3, v4, and v5, each of which may include or be linked to a plurality of secondary connectors X2, X3, X4, and X5, respectively. The tester 202 may further comprise a pair of external connectors X1S and X5S that may be linked to the voltage source 214 and ammeter 216. In some contexts, the primary power source 212, voltage source 214, and/or ammeter 216 may be linked to one or more of the voltmeters v1, v2, v3, v4, v5 and connectors X1, X2, X3, X4, X5, X1S, X5S. Furthermore, the tester 202 may comprise a secondary voltmeter that includes or is linked to the X1 secondary connector. In the implementation shown in FIG. 2, however, a secondary voltmeter corresponding to X1M is not necessary since the voltage output is generally assumed to be a known reference voltage (e.g., 0 volts).

As shown in FIG. 2, the tester 202 may include a plurality of phase meters $\varphi 2$, $\varphi 3$, $\varphi 4$, and $\varphi 5$ linked to the plurality of secondary voltmeters v2, v3, v4, and v5, respectively. One or more of the phase meters $\varphi 2$, $\varphi 3$, $\varphi 4$, and $\varphi 5$ may also be linked to the primary voltage source 214. Moreover, each of the secondary connectors X1, X2, X3, X4, and X5 of the tester 202 may be attached (e.g., via supply leads or the like) to corresponding secondary terminals x1, x2, x3, x4, and x5 of the CT 204. Similarly, the external connectors X1S and X5S may each be attached to corresponding terminals x1 and x5 of the CT 204.

When the components of the tester 202 are attached as shown, the voltage source 214 may apply a fixed or variable voltage to a secondary winding of the CT 204. The secondary voltmeters v2, v3, v4, and v5 can then be used to simultaneously measure voltage output from each secondary terminal x1, x2, x3, x4, and x5 of the CT 204, while the primary voltmeter 206 can be used to measure voltage output across the primary terminals H1 and H2 of the CT 204. In an embodiment, the phase meters $\varphi 2$, $\varphi 3$, $\varphi 4$, and $\varphi 5$ can be used to simultaneously measure phase angle between the primary voltage and each of the secondary voltages.

Additionally, the ammeter 216 may be used to measure current flowing through one or more of the secondary windings of the CT 204. In some implementations, measurements from the primary voltmeter 206, secondary voltmeters v2, v3, v4, and v5, and/or ammeter 216 may be displayed (e.g., via GUI 207) and/or stored (e.g., in database 209).

The tester 202 may obtain and process (e.g., via controller 201) measurements from the secondary voltmeters v2, v3, v4, and v5, the primary voltmeter 206, and/or the ammeter 216. As discussed below, the tester 202 may use these measurements and/or other information (e.g., current/voltage inputs at the primary/secondary windings, data provided from a nameplate and/or manufacturer of the CT 204, etc.) in order to perform calculations and tests for analyzing the CT 204. Some CT tests that the tester 202 may be configured to perform include, but are not limited, a ratio test, saturation test, knee point test, polarity test, winding resistance test, magnetizing test, excitation test, phase angle test, core loss test, load loss test, or any combination thereof. Additionally, the tester 202 may perform a CT test according to predefined and/or customizable algorithms and sequences.

When the voltage source 214 applies a voltage to the external winding (i.e., x1-x5), the tester 202 may perform a ratio test to determine the secondary to primary ratio (i.e., x1-x5:H1-H5) using voltage measurements across secondary terminals x1 and x5 and primary terminals H1 and H2. The tester 202 may use the secondary to primary ratio to calculate the saturation curve and knee point for the external winding (x1-x5) of the CT 204. In an embodiment, in addition to calculating the ratio, saturation curve, and knee point for the external winding (x1-x5), the tester 202 may calculate the ratio, saturation curve, and knee point for one or more other winding combinations by using measurements obtained during the same test.

That is, the tester 202 may perform a concurrent ratio test in which it uses simultaneous measurements to calculate a plurality of ratios by running a single test. As previously mentioned, multiple tests typically need to be performed to calculate the ratio for each winding combination of a CT. However, the tester 202 comprises multiple secondary voltmeters v2, v3, v4, and v5 that can simultaneously measure secondary voltages (e.g., at terminals x1, x2, x3, x4, and x5) as the primary voltmeter 206 measures the voltage induced across the primary winding of the CT 204. Based on the secondary and primary voltage measurements, the tester 202 may calculate the ratio for each winding (i.e., x1-x2, x1-x3, x1-x4, and x1-x5), as well as the ratio for each possible winding combination.

In an embodiment, so long as the measured ratio for each winding is known, all other CT saturation and knee point information can be mathematically derived using equations according to the present disclosure. For instance, the tester 202 may calculate the ratio, saturation curve, and/or knee point for the external winding (x1-x5) using measurements from the ammeter 216, the primary voltmeter 206, and the secondary voltmeter v5. Based on these calculations, the tester 202 may also calculate the ratio for the other three windings x1-x2, x1-x3, and x1-x4 by using measurements obtained from one or more secondary voltmeters v2, v3, v4, and v5. The secondary to primary ratio for each winding (i.e., x1-x2, x1-x3, x1-x4, and x1-x5) may generally be expressed as follows:

$N_{x1-x2}$=x1-x2:H1-H2,
$N_{x1-x3}$=x1-x3:H1-H2,
$N_{x1-x4}$=x1-x4:H1-H2, and
$N_{x1-x5}$=x1-x5:H1-H2.

In an embodiment, the tester 202 may be configured to calculate the secondary to primary ratios above, as well as associated current/voltage information, using the following equations:

$$V \text{ winding } a = V \text{ measured winding } x \times \left(\frac{\text{Ratio measured winding } a}{\text{Ratio measured winding } x}\right), \quad (1)$$

and $$C \text{ winding } a = C \text{ measured winding } x \times \left(\frac{\text{Ratio measured winding } x}{\text{Ratio measured winding } a}\right). \quad (2)$$

The parameters in the equations above may be defined as follows:

V measured winding x=Voltage point measured of winding actually tested (e.g., external winding x1-x5), V measured winding a=Voltage point measured of winding untested for Saturation and Knee point (e.g., internal winding x2-x3), Ratio measured winding x=Measured ratio of winding actually tested, Ratio measured winding a=Measured ratio of winding untested for Saturation and knee point, C measured winding x=Current point measured of winding actually tested, and C measured winding a=Current point measured of winding untested for Saturation and Knee point.

It can be seen that the tester 202 may solve any unknown variables in equations (1) and (2) by using measurements simultaneously obtained (e.g., as the primary voltmeter 206 measures voltage across terminals H1 and H2) by the secondary voltmeters v2, v3, v4, and v5 and ammeter 216. Thus, by simultaneously measuring all secondary voltages at terminals x1 (e.g., assumed to be 0 V or otherwise known), x2, x3, x4, x5, the tester 202 may use equations (1) and (2) above to calculate the secondary to primary ratio for each winding (i.e., x1-x2, x1-x3, x1-x4, and x1-x5). In turn, the tester 202 may use these same equations to calculate the ratios for the remaining winding combinations (i.e., x2-x3, x2-x4, x2-x5, x3-x4, x3-x5, x4-x5) based on the calculated winding ratios (i.e., $N_{x1-x2}$, $N_{x1-x3}$, $N_{x1-x4}$, $N_{x1-x5}$). The ratios for the remaining winding combinations may generally be expressed as follows:

$N_{x2-x3}$=x2-x3:H1-H2,
$N_{x2-x4}$=x2-x4:H1-H2,
$N_{x2-x5}$=x2-x5:H1-H2,
$N_{x3-x4}$=x3-x4:H1-H2,
$N_{x3-x5}$=x3-x5:H1-H2, and
$N_{x4-x5}$=x4-x5:H1-H2.

As with calculating the secondary to primary ratio for each winding, the tester 202 may solve any unknown variables in equations (1) and (2) to calculate the remaining ratios ($N_{x2-x3}$, $N_{x2-x4}$, $N_{x2-x5}$, $N_{x3-x4}$, $N_{x3-x5}$, $N_{x4-x5}$) using information simultaneously obtained (e.g., via primary voltmeter 206, secondary voltmeters v2, v3, v4, and v5, and/or ammeter 216) during a single test. Accordingly, by arranging an ammeter 216 and multiple secondary voltmeters v2, v3, v4, and v5 to simultaneously measure outputs at the secondary windings as a primary voltmeter 206 measures voltage induced across the primary winding, the tester 202 may obtain all current/voltage measurements necessary to calculate the ratios for each winding combination using equations (1) and (2) above.

In some implementations, the tester 202 may use the measured ratios ($N_{x1-x2}$, $N_{x1-x3}$, $N_{x1-x4}$, $N_{x1-x5}$, $N_{x2-x3}$, $N_{x2-x4}$, $N_{x2-x5}$, $N_{x3-x4}$, $N_{x3-x5}$, and $N_{x4-x5}$) and current/voltage data in performing CT tests to generate saturation curves and/or determine knee points. Moreover, the tester 202 may use excitation curves from the manufacturer of the CT 204 and/or previously generated (e.g., via tester 202) to compare the results for accuracy. In sum, the tester 202 may perform one or more suitable CT tests to confirm whether a CT (e.g., as supplied) is of the correct accuracy rating, has any shorted turns, and if any wiring or physical short circuits have developed in the primary or secondary windings after installation. Test results may be stored in a local database (e.g., in database 209) and/or remote database for comparison with other results and information. Further, the tester 202 may be optionally coupled to a local or remote printer to print test results.

It should be understood that the tester 202 may be applied to an N-tap CT comprising a primary winding and a second winding having N taps, where N is a positive integer greater than or equal to 1. For example, N is equal to 5 when the tester 202 is applied to the CT 204 in FIG. 2. In some embodiments, rather than initiating a test by applying a voltage to an external winding of the CT 204 (e.g., x1-x5 in FIG. 2), the voltage source 214 may apply voltage into any two taps of an N-tap CT such as the 5-tap CT 204 in FIG. 2. For discussion purposes, these two taps are designated as tap A and tap B, both of which are a subset of the 5 taps of the CT 204. In these embodiments, taps A and B can be selected from N taps arbitrarily, i.e., no direct or sequential relationship is necessary between tap A and tap B. For an N-tap CT, taps A and B can be selected from $N*(N-1)$ possible combinations. Therefore, for a 5-tap CT 204 as shown in FIG. 2, taps A and B can be selected from 20 different possible combinations (i.e., x1-x2, x1-x3, x1-x4, x1-x5, x2-x3, x2-x4, x2-x5, x3-x4, x3-x5, x4-x5, x2-x1, x3-x1, x4-x1, x5-x1, x3-x2, x4-x2, x5-x2, x4-x3, x5-x3, x5-x4).

After the voltage source 214 applies voltage into taps A and B, the secondary voltmeters v2, v3, v4, and v5 can be used to measure voltages across terminals A-B, A-x1, A-x2 ... A-xN, where xN is terminal x5 in this case. These voltage measurements may be represented as follows: ABVolt, A1Volt, A2Volt ... ANVolt. ABVolt represents the voltage measured across taps A and B; A1Volt represents the voltage measured across taps A and x1; A2Volt represents the voltage measured across taps A and x2; ANVolt represents the voltage across taps A and N, which is x5 in this case. As the secondary voltmeters v2, v3, v4, and v5 measure the aforementioned voltages, the primary voltmeter 206 can be used to measure the voltage induced across the primary terminals H1 and H2 of the CT 204.

In an embodiment, the tester 202 may be configured to employ one or more of the phase meters φ2, φ3, φ4, and φ5 to measure phase angles based on the measurement results discussed above. For example, the tester 202 may measure phase angle according to the equations set forth below:

$$A1H\text{Phase}=A1\text{Volt vs. }H\text{Volt};$$

$$A2H\text{Phase}=A2\text{Volt vs. }H\text{Volt};$$

$$\ldots$$

$$ABH\text{Phase}=AB\text{Volt vs. }H\text{Volt};$$

$$\ldots$$

$$ANH\text{Phase}=AN\text{Volt vs. }H\text{Volt},$$

where A1HPhase represents the phase angle measured as the voltage across taps A-x1 versus HVolt, which is the voltage measured across the primary terminals H1 and H2; A2HPhase represents the phase angle measured as the voltage across taps A-x2 versus HVolt; ABHPhase represents the phase angle measured as the voltage across taps A-B versus HVolt; and ANHPhase represents the phase angle measured as the voltage across taps A-N versus HVolt, where A-N is A-x5 in this case.

In an embodiment, instead of having a ratio between a secondary voltage to a primary voltage being a positive number, the tester 202 may be configured to derive each ratio as a signed number to indicate a direction, and then recalculate back the arbitrary taps A and B. To this end, the tester 202 may derive such ratios based on the following equations:

$$A1\text{Ratio}=A1\text{Volt}/H\text{Volt}*\cos(A1H\text{Phase});$$

$$A2\text{Ratio}=A2\text{Volt}/H\text{Volt}*\cos(A2H\text{Phase});$$

$$\ldots$$

$$AB\text{Ratio}=AB\text{Volt}/H\text{Volt}*\cos(ABH\text{Phase});$$

$$\ldots$$

$$AN\text{Ratio}=AN\text{Volt}/H\text{Volt}*\cos(ANH\text{Phase}).$$

After deriving the foregoing ratios, the tester 202 may perform various calculations (e.g., inter-tap voltage, excitation current, polarity, ratio, etc.) similarly as described above. However, since each ratio above is derived as a signed number, the results may grow higher or lower. Further, polarities may cancel out by taking the inverse cosine (Acos) of each ratio.

Figure 3A:
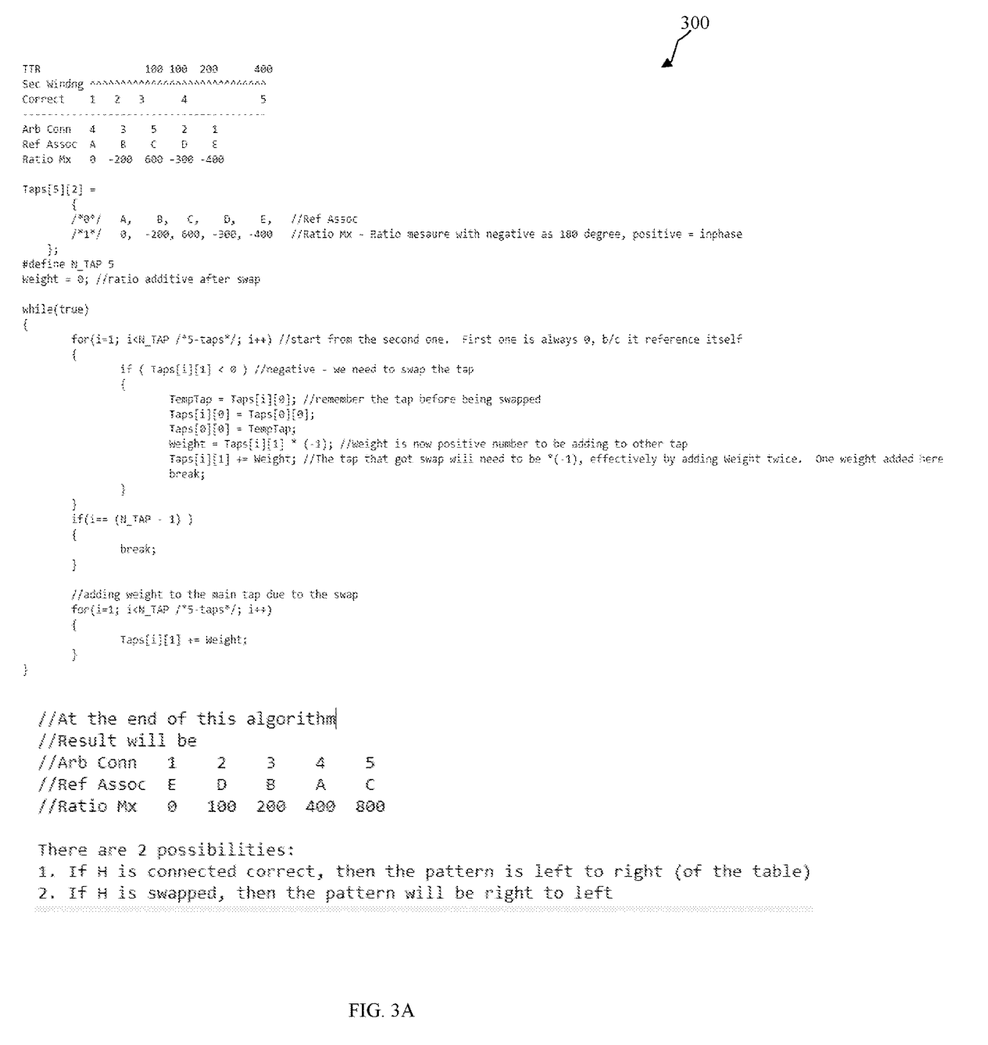
FIG. 3A is a pseudo-code algorithm according to an embodiment of the disclosure.

FIG. 3A is an example of an algorithm 300 that may be executed by the tester 202 to derive the correct order of tap connections using the above calculations as input. It can be seen from FIG. 3A that the algorithm allows the tester 202 to provide results reflecting the actual connection (including incorrect connections), e.g., whether or not the tester 202 is connected to the correct taps of the CT 204. It can also be seen that the algorithm allows the tester 202 to identify and/or sort the taps in the correct sequence. As such by energizing only two taps (e.g., A and B), the tester 202 can identify taps A and B, as well as all remaining taps of the N-tap CT 204. Since CT windings may be mis-labeled or difficult to connect, the ability of the tester 202 to correctly sort and identify each tap or secondary winding of the CT is beneficial to the user of the tester 202 and leads to proper testing of the CT. It should be understood that the algorithm shown in FIG. 3A is merely one example of an algorithm for carrying out a method for identifying CT characteristics (e.g., taps, sequences, correct/incorrect connections, etc.) as described herein. Those of ordinary skill in the art shall appreciate that other algorithms and equations may be used to implement similar procedures and derive similar results without departing from the scope of the present disclosure.

Figure 3B:
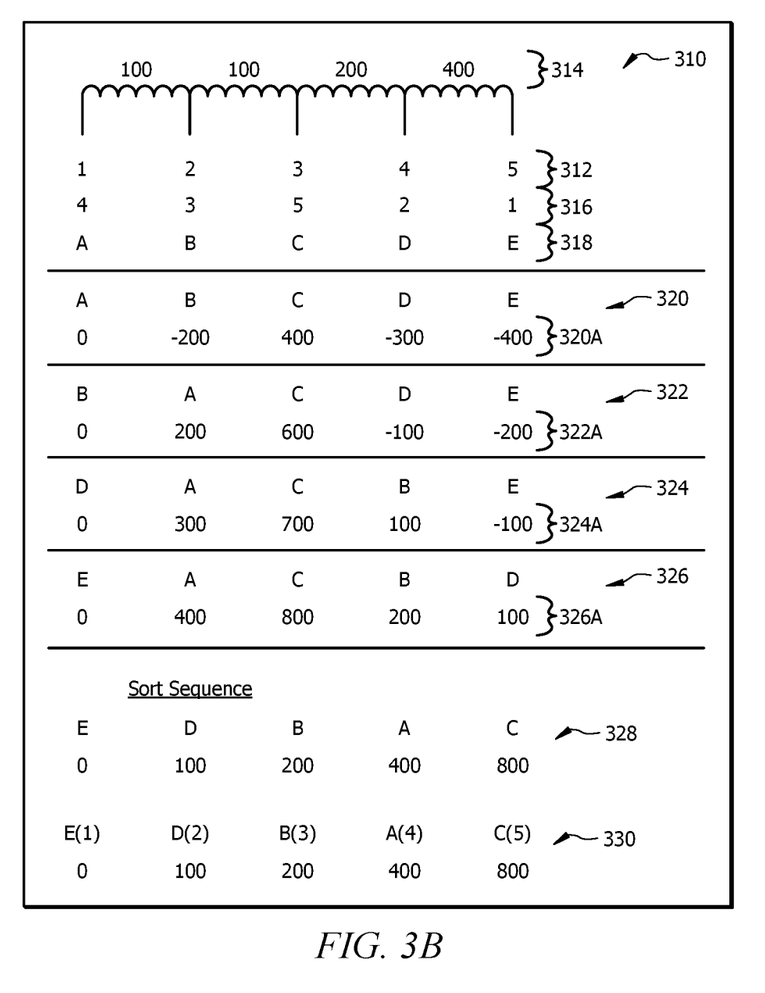
FIG. 3B is a state diagram according to an embodiment of the disclosure.

FIG. 3B is a state diagram 310 illustrating the algorithm 300 of FIG. 3A applied to a five-tap (5-tap) CT. Prior to determining or sorting the order of the taps as illustrated in the state diagram 310, the CT transformer turns ratios and phases have already been measured and calculated as described above. The state diagram 310 illustrates an exemplary CT with five (5) taps 312, (labeled 1, 2, 3, 4, 5, e.g., x1, x2, x3, x4, x5) and the associated four (4) transformer turns ratios or TTRs 314 (labeled 100, 100, 200, 400) where the first TTR 314(100) is x1-x2, the second TTR 314(100) is x2-x3, the third TTR 314(200) is x3-x4, the last TTR 314(400) is x4-x5.

In this example, the user has incorrectly or arbitrarily connected the tester 202 to the five taps 312, as show in the next row as arbitrary connections 316 (labeled in order 4, 3, 5, 2, 1). Thus, the user of the tester 202 does not know which actual, correct tap of the CT that is connected to which connection of the tester 202. The next row of letters 318 (labeled A, B, C, D, E) is provided as a reference for the connections in the state diagram 310. As can be seen letter 318(A) is aligned under arbitrary connection 316(4). The user is unaware which actual tap 312 that test connection 316(4) actually maps or connects to. In this case arbitrary connection 316(4) is actually connected to tap 312(4).

The state diagram 310 uses the previously calculated transformer turns ratios and phases for each secondary winding. The ratio measures are with a negative as 180 degrees, and positive as in-phase. At state 320 the weights 320(A) of the taps are compared initially in order A-E (i.e., A-A, A-B, A-C, A-D, A-E). The first tap measured will always be zero (0) because that tap is measured with reference to itself. Thus, letter 318(A) has a weight 320(A) of 0 since it is measured or weighed against itself. Next the A-B measurement is calculated. Letter 318(A) maps to arbitrary tap 316(4) and actual tap 312(4), while letter 318(B) maps to arbitrary tap 316(3) and actual tap 312(3). The weight of the ratios between the actual taps 312(4) and 312(3), taking into account the phase angle, has a weight 320A (A-B) of −200.

Next the A-C measurement is calculated. Again, letter 318(A) maps to arbitrary tap 316(4) and actual tap 312(4), while letter 318(C) maps to arbitrary tap 316(5) and actual tap 312(5). The weight of the ratios between the actual taps 312(4) and 312(5), taking into account the phase, has a weight 320A (A-C) of 400.

Next the A-D measurement is calculated. Again, letter 318(A) maps to arbitrary tap 316(4) and actual tap 312(4), while letter 318(D) maps to arbitrary tap 316(2) and actual tap 312(2). The weight of the ratios between the actual taps 312(4) and 312(2), taking into account the phase, has a weight 320A (A-D) of −300.

Next the A-E measurement is calculated. Again, letter 318(A) maps to arbitrary tap 316(4) and actual tap 312(4), while letter 318(E) maps to arbitrary tap 316(1) and actual tap 312(1). The weight of the ratios between the actual taps 312(4) and 312(1), taking into account the phase, has a weight 320A (A-E) of −400.

Once all the arbitrary tap connections have been measured at 320A, the algorithm 300 will identify the correct tap order and their corresponding ratio. The algorithm 300 has two (2) general steps. The first step includes A) identify the first negative weight, B) for the tap with the first negative weight, multiply the weight of the first negative tap by negative one (−1), then double the result, and add the doubled result to the weight of the first negative tap, C) swap the positions or labels of the first tap with that of the tap with the first negative weight, D) for the remaining taps, add the result (the first negative tap weight multiplied by −1) to the weight of each tap, and E) and repeat steps A-D until the weights of all the taps are positive. The second step is to sort the taps sequentially by weight to identify the correct tap order. Once these weights are adjusted, they become the tap ratio which completes the algorithm 300. Further, as noted in FIG. 3A, if the primary winding (H) is connected correctly, the sort order of the taps is left-to-right, if the primary winding (H) is swapped, the correct sort order is right-to-left.

As an example of the first step of the algorithm 300, step one (A) identifies the 320(B) as the tap with the first negative weight of −200 (320A(B)). At step one (B), the algorithm uses the tap 320(B), which is the tap with the first negative weight (e.g. −200) and multiplies the weight of the first negative tap by −1, then doubles the result, and adds the doubled result to the weight of the first negative tap (e.g., ((−200)(−1)(2))+(−200)=200, see 322(A) weight). At step one (B) the algorithm 300 swaps the labels of the first tap, here 320(A) with that of first tap with a negative weight, here tap 320(B). This is shown in 322 where A and B are swapped to B and A.

At step one (D), the result (the first negative tap weight multiplied by −1 or 200 in this example) is added to the weight 320A of each remaining tap, which is then provided as the weights in the next step 322A. For example, the result (200) is added to each of the weights 320A of taps 320(C, D, E) to achieve the revised weights 322A of taps 322(C, D, E).

Continuing the example, at 322, the algorithm 300 identifies the tap 322(D) as the tap with the first negative weight 322A of −100. The algorithm 300 swaps the labels of the first tap, here 322(B) with that of the first tap with a negative weight, here 322(D). This is shown in 324 where the locations of B and D are swapped. Next, the algorithm uses the tap 322(D) with the first negative weight (−100) and multiplies the weight of the first negative tap by −1, then doubles the result, and adds the doubled result to the weight of the first negative tap (e.g., ((−100)(−1)(2))+(−100)=100, see 324(B) weight). Next, the algorithm 300 adds the result (the first negative tap weight multiplied by −1 or 100 in this example) to the weight 322A of each remaining tap, which is then provided as the weights in the next step 324A. For example, the result (100) is added to each of the weights 322A of taps 322(A. C, E) to achieve the revised weights 324A of taps 324(A, C, E).

The algorithm 300 repeats the above steps until all the weights are positive, which in this example occurs in 326. At the end of 326, all the weights are positive, so the algorithm will proceed to the second or final general step. At the second general step, the algorithm 300 sorts the weight sequentially 328, which provides the correct tap order and the corresponding ratios 330. As mentioned above, if the primary winding (H) is connected correctly, the sort order of the taps is left-to-right, if the primary winding (H) is swapped, the correct sort order is right-to-left.

Figure 4:
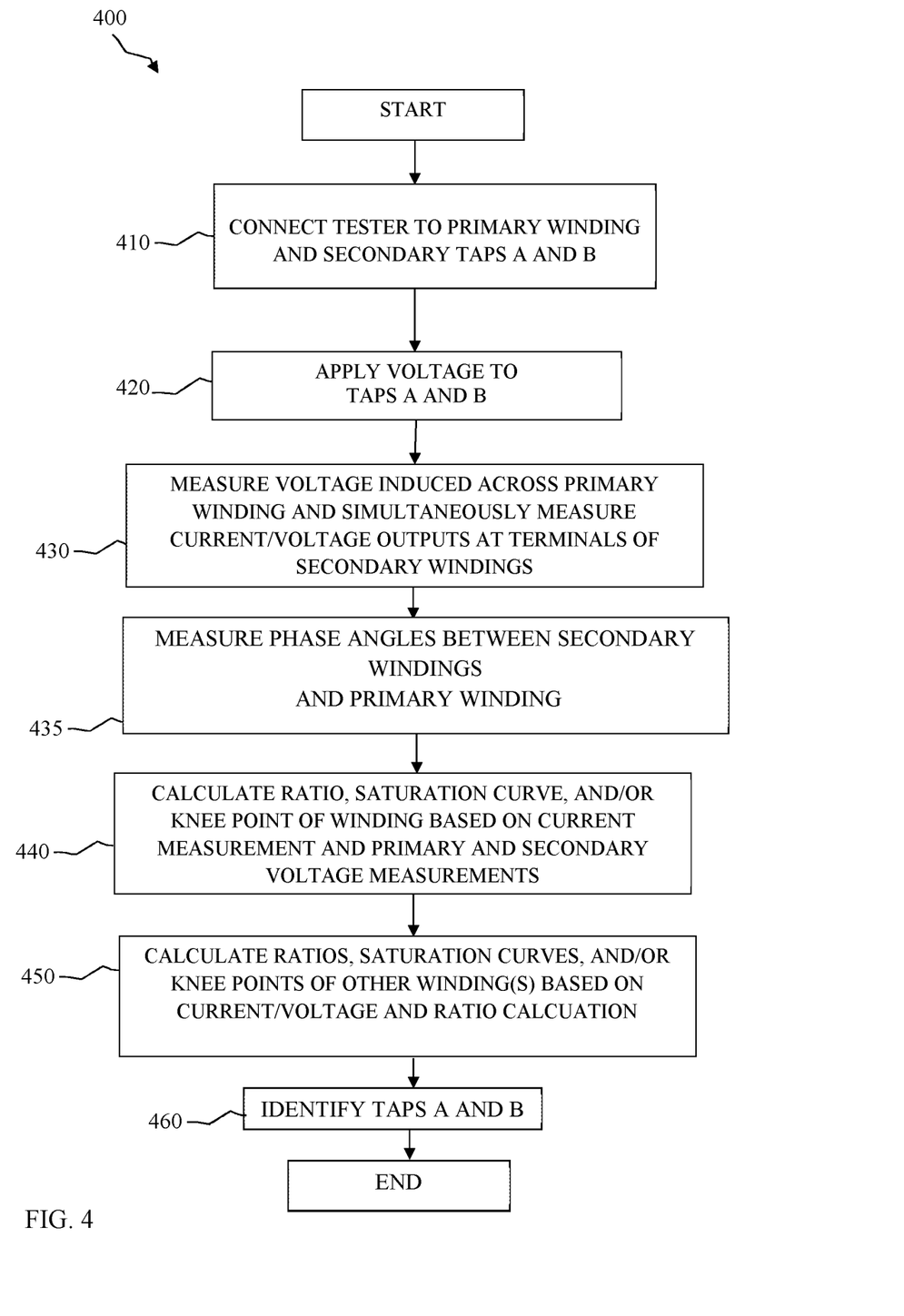
FIG. 4 is a flowchart of a method for testing a transformer according to an embodiment of the present disclosure.

Turning now to FIG. 4, a flowchart of a method 400 for testing an N-tap CT is described. The operations in the method 400 may be performed in the order shown, or in a different order. Further, two or more of the operations of the method 400 may be performed concurrently instead of sequentially. The method 400 comprises connecting a tester to the terminals of the secondary and primary windings of the CT at block 410. In some embodiments, it is not necessary to energize a predetermined winding (e.g., x1-x5). For example, the tests described herein can be conducted by connection to all the taps or secondary windings and only energizing two (and any two) of the second windings. Also, the energized connections do not have to be the connections to either of x1 or x5 of the CT. Indeed, the taps of the secondary winding may be selected arbitrarily. Therefore, the method 400 may commence by connecting the tester to the primary and secondary windings and energizing any two or more taps of the N-tap CT. For discussion purposes, in this example, only two taps are energized and the two energized taps are designated as taps A and B.

At block 420, a voltage is applied to the terminals of taps A and B of the CT. At block 430, the method 400 includes measuring voltage induced on the primary winding while simultaneously measuring current and/or voltage outputs at the terminals of multiple secondary windings. In some embodiments, voltage outputs at the terminal of each secondary winding are simultaneously measured in block 430. At block 435, the method 400 includes measuring phase angles between the secondary windings and the primary winding. These measurements may be performed based on the phase angle equations discussed above.

Continuing with block 440, the ratio, saturation curve, and/or knee point of the winding to which voltage was applied in block 420 is calculated based on the current and the primary and secondary voltage measurements of that winding. At block 450, the ratio, saturation curve, and/or knee point of one or more other windings are calculated based on the current/voltage measurements from block 430 and the ratio calculated in block 440. Thus, the method 400 may calculate the ratio for all possible winding combinations in block 450.

At block 460, the method 400 includes identifying taps A and B based on the results obtained in blocks 435, 440, and 450. For example, by using the phase angle measurements from block 435, the method 400 can determine the order of the N taps in correct sequence and identify taps A and B as well as all remaining taps. In some embodiments, block 460 may be performed at any point following block 430. For example, the method 400 may be able to identify taps A and B based on the polarity characteristics derived from the phase angle measurements in block 435. The method 400 ends at block 460. The test 202 may further display or identify, such as on a display of the test 202 or other device, the correct tap connections, the taps incorrectly connected, or otherwise provide the user with visual or other indication to assist the user in identifying the tap order, ratios, and other information described herein about the CT being tested, measured.

In some embodiments, the tester 202 (or controller 201) may receive inputs (e.g., via I/O 205) that are used to define test types (e.g., ratio tests, burden tests, polarity tests, excitation tests, knee point tests, phase angle tests, impedance tests, insulation tests, resistance tests, magnetization tests, etc.), test values, and/or parameter values. Such inputs may be in the form of an alphanumeric text entered into fields of a displayable test form. Additionally or alternatively, inputs may be at least partly in the form of selections via a display (e.g., GUI 207) providing menu drop-down buttons or options. Inputs may define the direction of current flow in the power system component under test, for example, the CT 204. Inputs may also define the amount of current or voltage provided by the tester 202 to a tested component. Inputs may also define an expected resistance range of the transformer windings. Furthermore, the tester 202 may receive inputs to command test state transitions, e.g., a start command, stop command, repeat command, etc. Additionally or alternatively, the tester 202 may receive inputs to command what is displayed by the display component, e.g., applied current, measured voltage or calculated resistance.

In an embodiment, the tester 202 may include one or more analog-to-digital converters to capture the voltage and/or current of a tested device (e.g., CT 204) and other circuitry to store the digital values in a memory (e.g., 209). Moreover, the tester 202 (or controller 201) may include other circuitry or processing capabilities to analyze captured responses to determine a test result parameter. Test result parameters may include, but are not limited to, a resistance of a winding, an impedance of a winding or insulation, polarity of the transformer, burden, or any combination thereof. The tester 202 (or controller 201) may receive and analyze unprocessed data to determine one or more test result parameters.

In an embodiment, the tester 202 may be self-contained such that all or most of its components may be contained within a single unit or case. The tester 202 may readily be employed for testing power system components other than transformers, including instrument transformers, cables, generators, electric motors, rotating machines, batteries, protection relays, circuit breakers, etc.

While discussion of the tester 202 may generally be limited with respect to the tester shown in FIG. 2 and features disclosed herein, those versed in the art will appreciate that the tester 202 may comprise additional or alternative circuitry and components commonly employed in devices employed for testing generators, transformers, and the like. Briefly, for example, the tester 202 may comprise or be operatively connected to at least one analog-to-digital converter (ADC), digital-to-analog converter (DAC), amplifier, multiplexer, inverter, filter, resistor, capacitor, etc.

The systems and features described above may comprise one or more processing components capable of executing instructions related to the methods and/or operations disclosed herein. For instance, all or parts of the testers (e.g., 202) described above may be implemented using at least one general-purpose computer or network component with sufficient processing power, memory resources, and network throughput capability to handle the necessary workload placed upon it. Additionally, appropriate mechanical and electrical shielding may be provided to protect the general-purpose computer or network component from harsh environments (e.g., electrical power systems) in which it might be employed.

Figure 5:
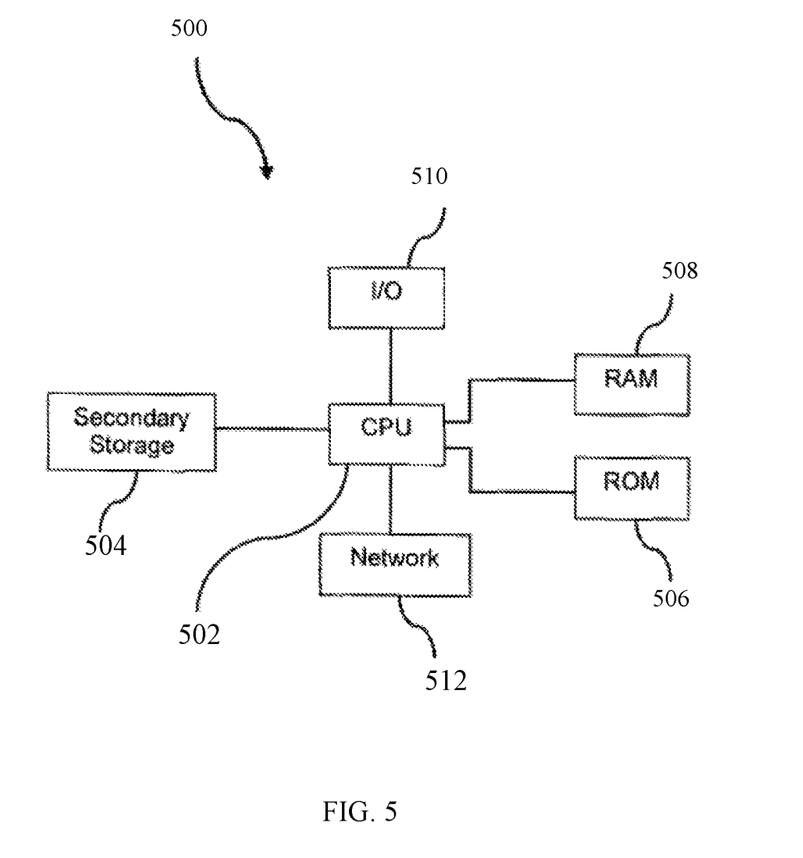
FIG. 5 is a schematic diagram of a computer according to an embodiment of the disclosure.

Turning now to FIG. 5, an embodiment of a computer system 500 will now be described. The computer system 500 may be used to implement any of the systems, components, and/or methods disclosed herein. For example, tester 202 may include some or all of the components of the computer system 500. In addition, in some embodiments, the computer system 500 may be in communication with the tester 202 and provide similar and/or additional functionality, such as, but not limited to, access to manufacturing data or details regarding the CT being tested, access to various test procedures, and so on. The computer system 500 includes a central processor unit (CPU) 502 or processor that is in communication with memory devices including secondary storage 504, read only memory (ROM) 506, random access memory (RAM) 508, input/output (I/O) devices 510, and network connectivity devices 512. The processor 502 may be implemented as one or more CPU chips.

The secondary storage 504 is typically comprised of one or more disk drives or tape drives and is used for non-volatile storage of data and as an over-flow data storage device if RAM 508 is not large enough to hold all working data. Secondary storage 504 may be used to store programs which are loaded into RAM 508 when such programs are selected for execution. The ROM 506 is used to store instructions and perhaps data which are read during program execution. ROM 506 is a non-volatile memory device which typically has a small memory capacity relative to the larger memory capacity of secondary storage. The RAM 508 is used to store volatile data and perhaps to store instructions. Access to both ROM 506 and RAM 508 is typically faster than to secondary storage 504.

I/O devices 510 may include printers, video monitors, liquid crystal displays (LCDs), touch screen displays, keyboards, keypads, switches, dials, mice, track balls, voice recognizers, card readers, paper tape readers, or other well-known input devices.

The network connectivity devices 512 may take the form of modems, modem banks, Ethernet cards, universal serial bus (USB) interface cards, serial interfaces, token ring cards, fiber distributed data interface (FDDI) cards, wireless local area network (WLAN) cards, radio transceiver cards such as code division multiple access (CDMA), global system for mobile communications (GSM), long-term evolution (LTE), worldwide interoperability for microwave access (WiMAX), and/or industrial, scientific, medical (ISM) band radio transceiver cards, and other well-known network devices. These network connectivity devices 512 may enable the processor 502 to communicate with an Internet or one or more intranets. With such a network connection, it is contemplated that the processor 502 might receive information from the network, or might output information to the network in the course of performing the above-described method steps. Such information, which is often represented as a sequence of instructions to be executed using processor 502, may be received from and outputted to the network, for example, in the form of a computer data signal embodied in a carrier wave Such information, which may include data or instructions to be executed using processor 502 for example, may be received from and outputted to the network, for example, in the form of a computer data baseband signal or signal embodied in a carrier wave. The baseband signal or signal embodied in the carrier wave generated by the network connectivity devices 512 may propagate in or on the surface of electrical conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embodied in the carrier wave, or other types of signals currently used or hereafter developed, referred to herein as the transmission medium, may be generated according to several methods well known to one skilled in the art.

The processor 502 executes instructions, codes, computer programs, scripts which it accesses from hard disk, floppy disk, optical disk (these various disk based systems may all be considered secondary storage 504), ROM 506, RAM 508, or the network connectivity devices 512. While only one processor 502 is shown, multiple processors may be present. Thus, while instructions may be discussed as executed by a processor, the instructions may be executed simultaneously, serially, or otherwise executed by one or multiple processors.

In some implementations, any of the various embodiments and aspects disclosed herein may be combined with the computer system 500 or component(s) thereof. In an embodiment, at least one computer readable medium is provided. The computer readable medium may be configured to store computer readable instructions executable by at least one processor (e.g., CPU 502) of a computing device to cause said computing device to implement any of the aspects described herein. The computer readable medium may be configured to receive data from one or more components or sources associated with the various aspects disclosed herein. Moreover, the at least one processor may use this and/or other data to cause said computing device to calculate measurements (e.g., current and/or voltage ratios) and/or perform various tests associated with transformers or the like.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A method for testing a transformer, the method comprising:
    applying an input voltage to any two secondary taps of the transformer in order to induce an induced voltage in a primary winding of the transformer;
    measuring the induced voltage in the primary winding, and measuring secondary voltages in a plurality of secondary windings of the transformer;
    simultaneously measuring phase angles as a function of the secondary voltages and the induced voltage;
    calculating a plurality of winding ratios based on the induced voltage measurement, the secondary voltage measurements, and the phase angle measurements; and
    identifying all secondary taps based on the phase angle measurements and the plurality of winding ratios.

2. The method of claim 1, wherein measuring the secondary voltages in the plurality of secondary windings of the transformer includes simultaneously measuring the secondary voltages in the plurality of secondary windings of the transformer.

3. The method of claim 1, wherein the method further comprises:
    using the phase angles and windings measurements to determine a first weight between a first tap (A) of the secondary taps and each of remaining secondary taps; and
    determining a weight of the first tap (A) by measuring the weight of the first tap (A) against itself such that the weight of the first tap (A) is zero.

4. The method of claim 3, wherein the method further comprises the steps of:
    1) Determining a tap (B) having a first negative weight;
    2) Determining a new weight of the tap (B) by multiplying the negative weight of the tap (B) by negative one (−1) to obtain a first weight calculation, doubling the first weight calculation, and then adding the doubled first weight calculation to the negative weight of the tap (B);
    3) Swapping an order of the first tap (A) with that of the tap (B); and 4) determining a new weight for each of remaining taps (C, D, E) by adding a weight of each of the remaining taps (C, D, E) to the first weight calculation.

5. The method of claim 4, wherein the method further comprises:
determining whether weights of all of the secondary taps are positive weights;
when the weights of all of the secondary taps are not positive weights, repeating steps 1-4 until all the weights of all of the secondary taps are positive; and
when the weights of all of the secondary taps are positive weights, determining a sort order based on ascending values of the positive weights of all of the secondary taps.

6. The method of claim 5, wherein when the primary winding (H) is connected correctly, the sort order of the secondary taps is left-to-right, and wherein when the primary winding (H) is swapped, the order is right-to-left.

7. The method of claim 1, wherein identifying all the secondary taps based on the phase angle measurements and the plurality of winding ratios further includes displaying, on a display, a sort order of the secondary taps.

8. A system for testing a transformer, comprising:
a voltage source configured to apply an input voltage to a secondary winding of the transformer, wherein the input voltage is configured to induce an induced voltage in a primary winding of the transformer;
a primary voltmeter configured to measure the induced voltage in the primary winding;
a plurality of secondary voltmeters configured to measure a plurality of secondary voltages corresponding to a plurality of secondary windings of the transformer when the input voltage is applied;
one or more phase angle meters to simultaneously measure a plurality of phase angles between the induced voltage and each of the plurality of secondary voltages; and
a controller operatively connected to the voltage source, the primary voltmeter, the plurality of secondary voltmeters, and the one or more phase angle meters, wherein the controller is configured to calculate a plurality of winding ratios based on the induced voltage measurement, the secondary voltage measurements, and the phase angle measurements, wherein the controller is further configured to identify all secondary taps based on the phase angle measurements and the plurality of winding ratios.

9. The system of claim 8, wherein measuring the secondary voltages in the plurality of secondary windings of the transformer includes simultaneously measuring secondary voltages in the plurality of secondary windings of the transformer.

10. The system of claim 8, wherein the controller is further configured to:
use the phase angle measurements and windings measurements to determine a first weight between a first tap (A) of the secondary taps and each of remaining secondary taps; and
determine a weight of the first tap (A) by measuring the weight of the first tap (A) against itself such that the weight of the first tap (A) is zero.

11. The system of claim 10, wherein the controller is further configured to:
1) Determine a tap (B) having a first negative weight;
2) Determine a new weight of the tap (B) by multiplying the negative weight of the tap (B) by negative one (−1) to obtain a first weight calculation, doubling the first weight calculation, and then adding the doubled first weight calculation to the negative weight of the tap (B);
3) Swap an order of the first tap (A) with that of the tap (B); and
4) determine a new weight for each of remaining taps (C, D, E) by adding a weight of each of the remaining taps (C, D, E) to the first weight calculation.

12. The system of claim 11, wherein the controller is further configured to:
determine whether weights of all the secondary taps are positive weights;
when the weights of all the secondary taps are not positive weights, repeat steps 1-4 until all the weights of all the secondary taps are positive; and
when the weights of all the secondary taps are positive weights, determine a sort order based on ascending values of the positive weights of all the secondary taps.

13. The system of claim 12, wherein the controller is further configured such that when the primary winding (H) is connected correctly, the sort order of the secondary taps is left-to-right, and wherein when the primary winding (H) is swapped, the sort order is right-to-left.

14. The system of claim 13, further comprising a display, wherein the sort order of the secondary taps is displayed on the display.

15. A system for testing a transformer, comprising:
a processor; and
a memory storing instructions that when executed by the processor cause the processor to:
receive a measurement of an induced voltage of a primary winding, measurements of secondary voltages in a plurality of secondary windings of the transformer, simultaneous measurements of a plurality of phase angles between the induced voltage of the primary winding and each of the secondary voltages of the plurality of secondary windings;
calculate a plurality of winding ratios based on the induced voltage measurement, the secondary voltage measurements, and the phase angle measurements; and
identify all secondary taps based on the phase angle measurements and the plurality of winding ratios.

16. The system of claim 15, wherein the measurement of the secondary voltages in the plurality of secondary windings of the transformer includes simultaneous measurements of the secondary voltages in the plurality of secondary windings of the transformer.

17. The system of claim 16, wherein the instructions when executed by the processor cause the processor to:
use the phase angle measurements and windings measurements to determine a first weight between a first tap (A) of the secondary taps and each of remaining secondary taps; and
determine a weight of the first tap (A) by measuring the weight of the first tap (A) against itself such that the weight of the first tap (A) is zero.

18. The system of claim 17, wherein the instructions when executed by the processor cause the processor to:
1) Determine a tap (B) having a first negative weight;
2) Determine a new weight of the tap (B) by multiplying the negative weight of the tap (B) by negative one (−1) to obtain a first weight calculation, doubling the first weight calculation, and then adding the doubled first weight calculation to the negative weight of the tap (B);
3) Swap an order of the first tap (A) with that of the tap (B); and 4) determine a new weight for each of remaining taps (C, D, E) by adding a weight of each of the remaining taps (C, D, E) to the first weight calculation.

19. The system of claim 18, the instructions when executed by the processor cause the processor to:
determine whether weights of all the secondary taps are positive weights;
when the weights of all the secondary taps are not positive weights, repeat steps 1-4 until all the weights of all the secondary taps are positive; and
when the weights of all the secondary taps are positive weights, determine a sort order based on ascending values of the positive weights of all the secondary taps.

20. The system of claim 19, further comprising a display, wherein the sort order of the secondary taps is displayed on the display.

* * * * *